United States Patent
Mizukoshi et al.

(10) Patent No.: US 12,022,668 B2
(45) Date of Patent: Jun. 25, 2024

(54) SEMICONDUCTOR DEVICE AND METHOD OF MANUFACTURING THE SAME

(71) Applicant: KIOXIA Corporation, Tokyo (JP)

(72) Inventors: Masanori Mizukoshi, Yokkaichi Mie (JP); Hisashi Okuchi, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 377 days.

(21) Appl. No.: 17/546,772

(22) Filed: Dec. 9, 2021

(65) Prior Publication Data

US 2023/0092237 A1    Mar. 23, 2023

(30) Foreign Application Priority Data

Sep. 22, 2021   (JP) .................. 2021-154491

(51) Int. Cl.
*H10B 63/00* (2023.01)
*H01L 23/48* (2006.01)
*H10N 70/00* (2023.01)

(52) U.S. Cl.
CPC .......... *H10B 63/84* (2023.02); *H01L 23/481* (2013.01); *H10N 70/011* (2023.02); *H10N 70/841* (2023.02); *H10N 70/8825* (2023.02)

(58) Field of Classification Search
CPC ......... H10B 63/00; H10N 70/00; H01L 23/48
See application file for complete search history.

(56) References Cited

U.S. PATENT DOCUMENTS 8,097,538 B2   1/2012  Koide et al.
11,145,810 B2  10/2021  Kawai

FOREIGN PATENT DOCUMENTS

| JP | H7-142591 A | 6/1995 |
| JP | H8-83965 A | 3/1996 |
| JP | 2004-207354 A | 7/2004 |
| JP | 2010-251596 A | 11/2010 |
| JP | 2020-155569 A | 9/2020 |
| WO | WO 2020/111007 A1 | 6/2020 |
| WO | WO 2021/015030 A1 | 1/2021 |

*Primary Examiner* — Marvin Payen
(74) *Attorney, Agent, or Firm* — Finnegan, Henderson, Farabow, Garrett & Dunner, LLP

(57) ABSTRACT

In one embodiment, a method of manufacturing a semiconductor device includes forming a first layer including a metal element on a substrate, and processing the first layer by dry etching. The method further includes removing a second layer formed on a lateral face of the first layer by wet etching, after processing the first layer, and forming a first film on the lateral face of the first layer by processing the lateral face of the first layer with a liquid, after removing the second layer. Furthermore, the substrate is not exposed to ambient air, after removing the second layer and before forming the first film.

20 Claims, 14 Drawing Sheets

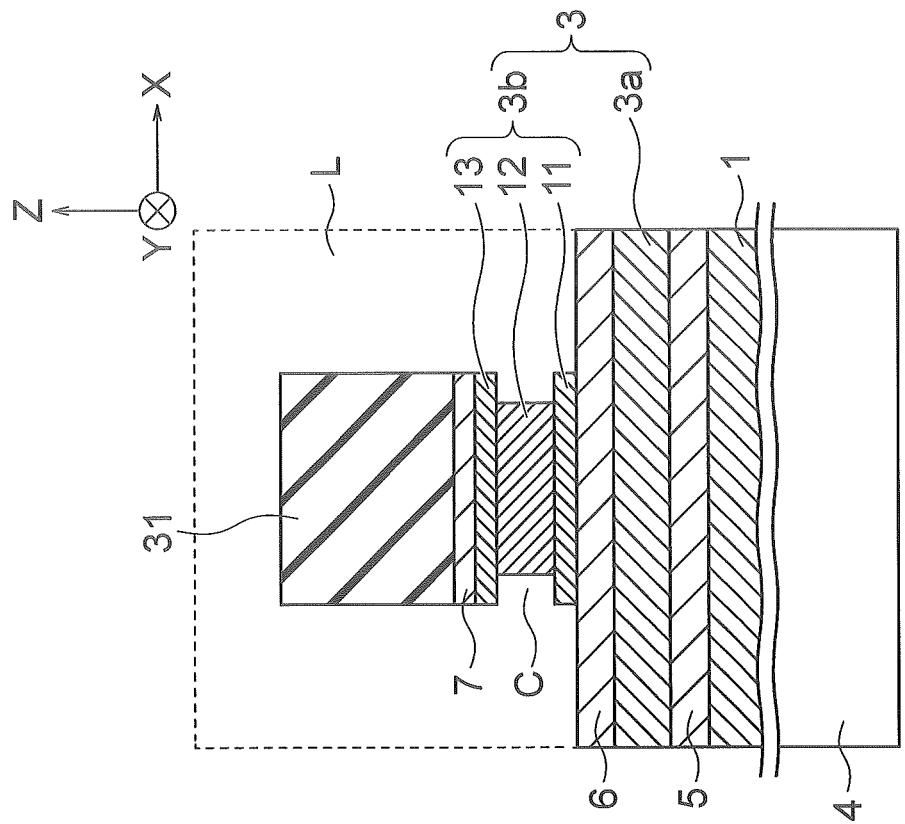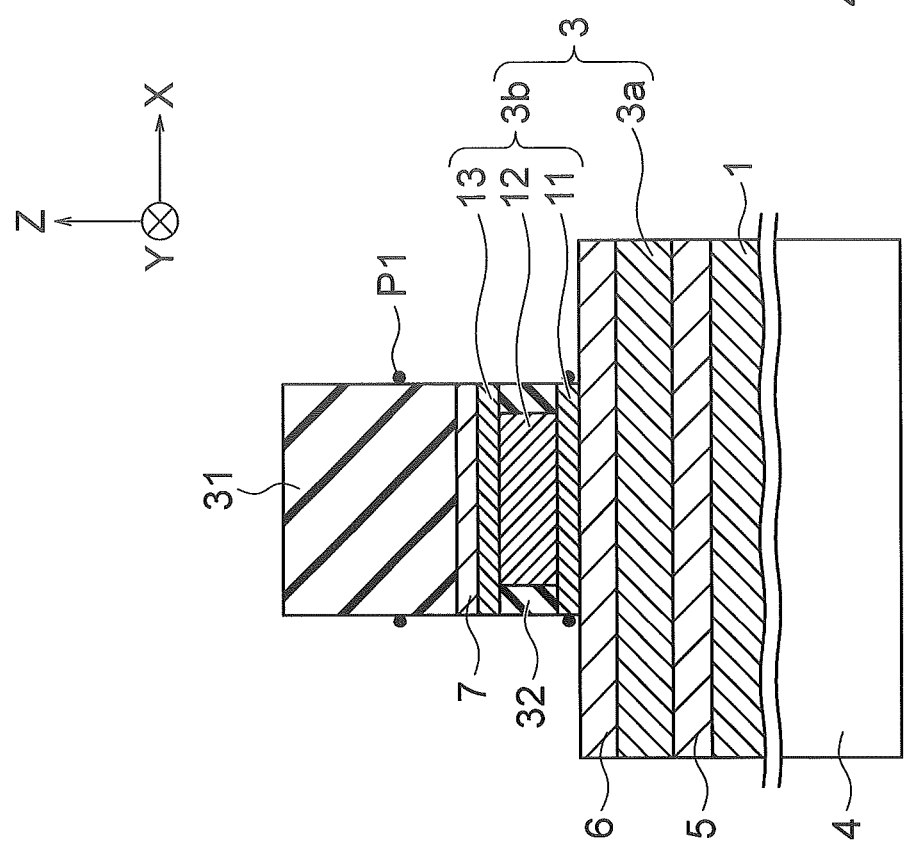

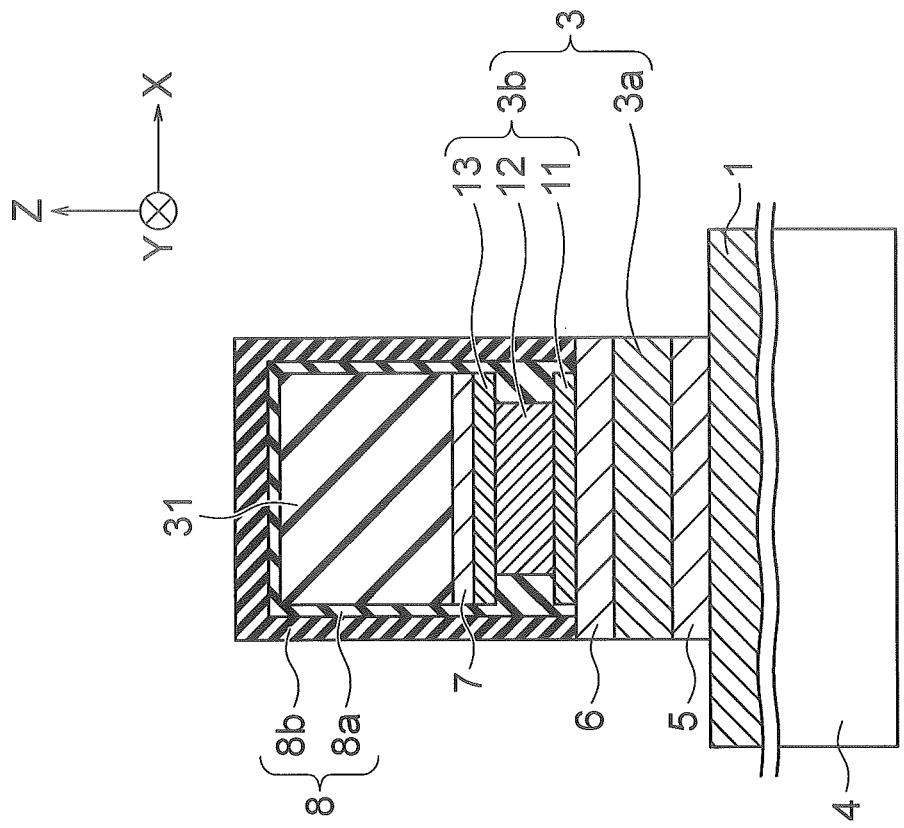
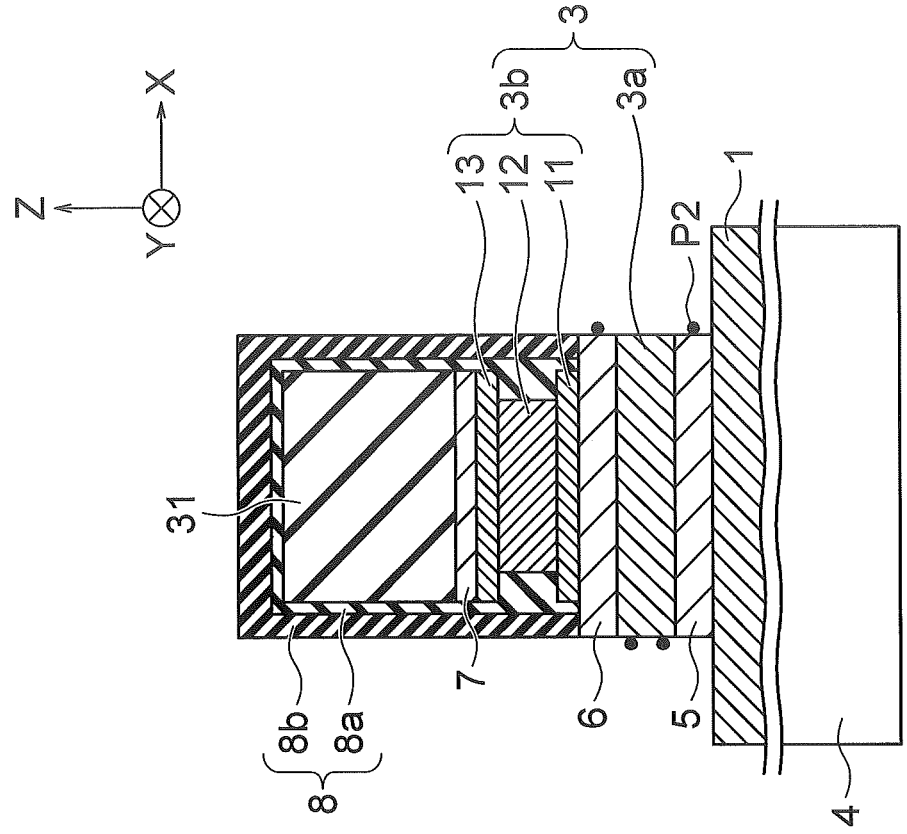

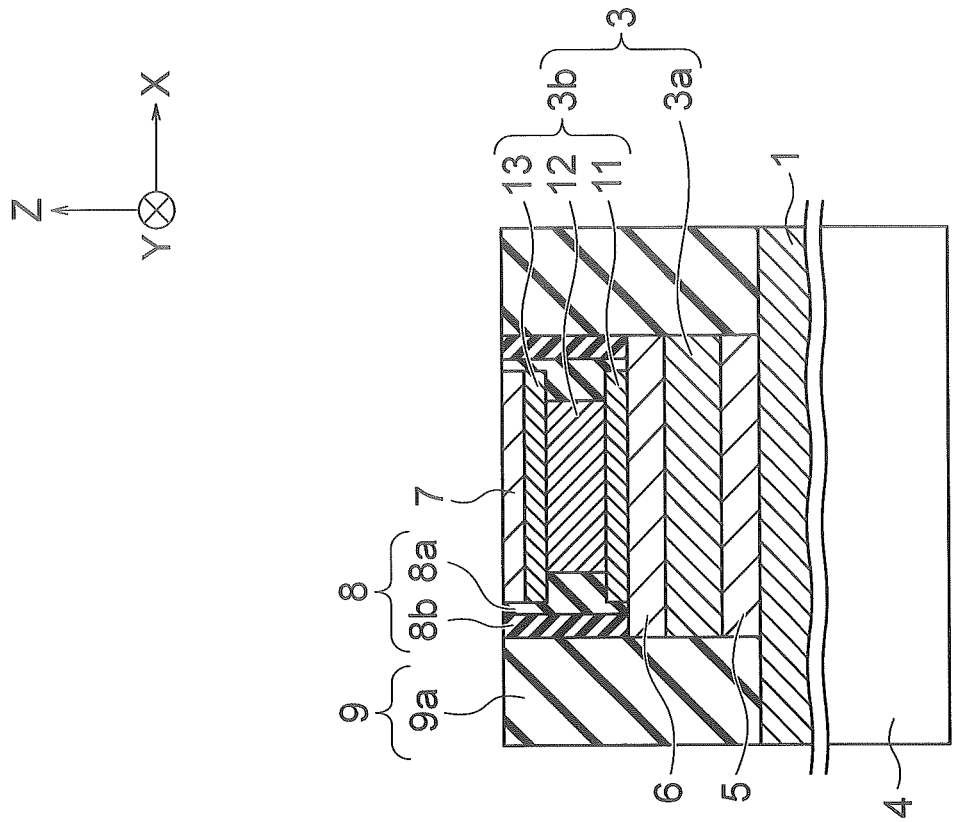
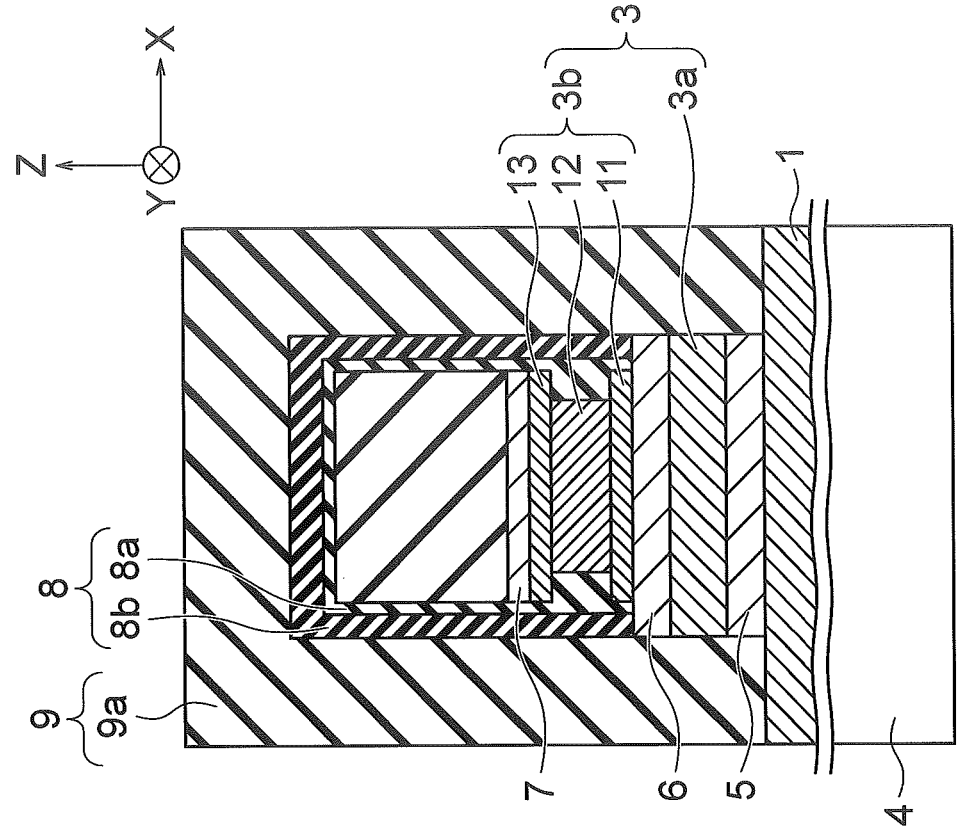
FIG. 8A
FIG. 8B

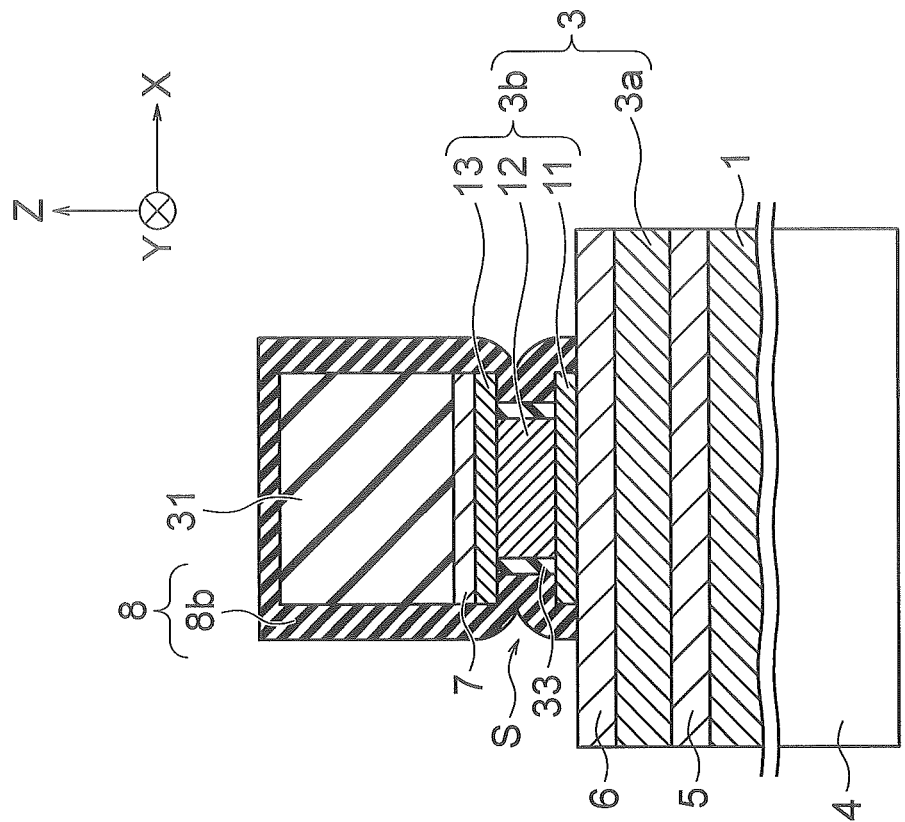
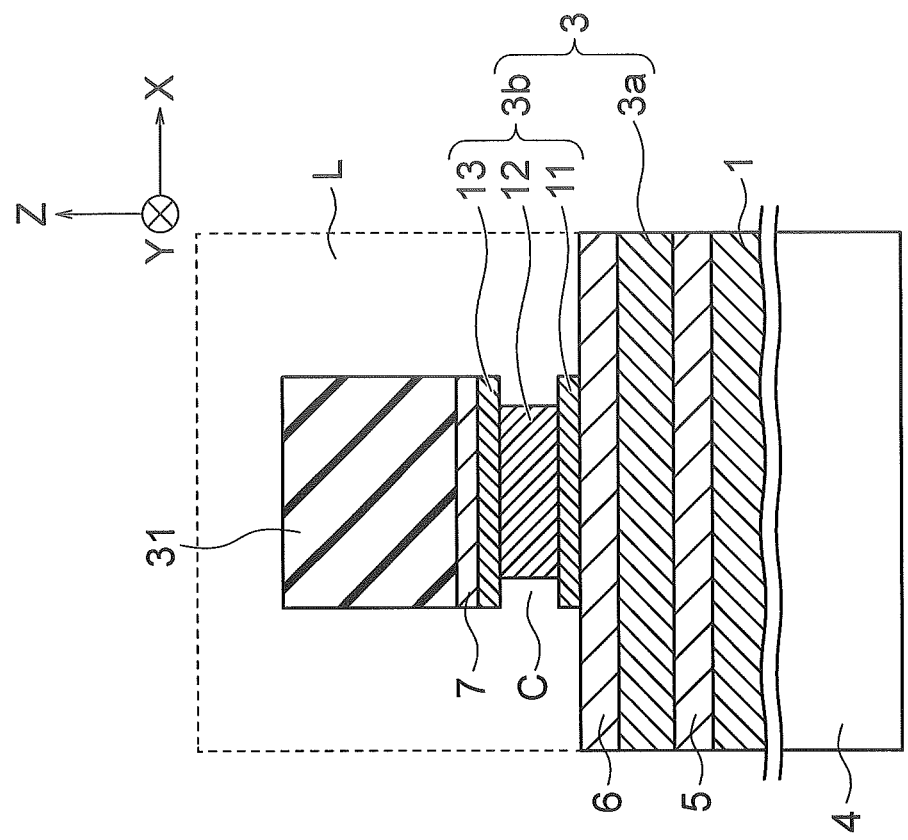

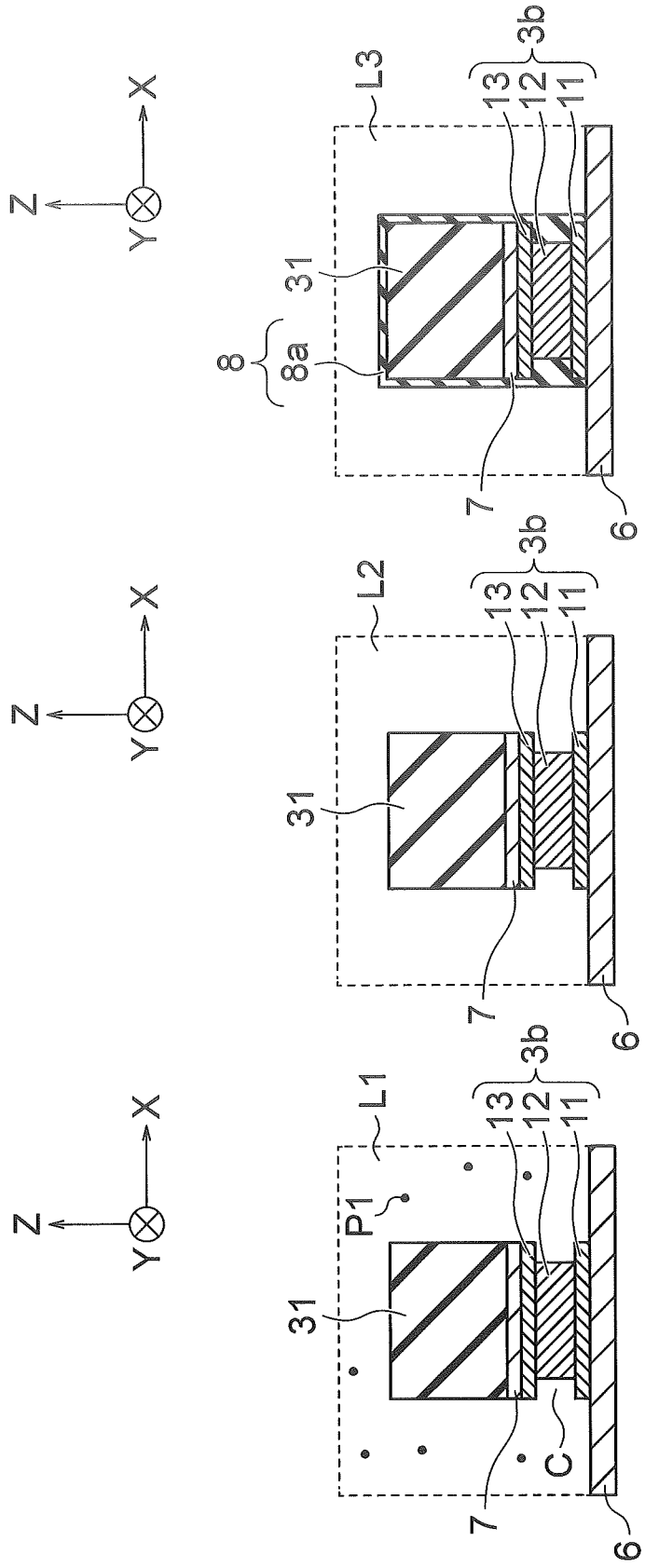

SEMICONDUCTOR DEVICE AND METHOD OF MANUFACTURING THE SAME

CROSS REFERENCE TO RELATED APPLICATION

This application is based upon and claims the benefit of priority from the prior Japanese Patent Application No. 2021-154491, filed on Sep. 22, 2021, the entire contents of which are incorporated herein by reference.

FIELD

Embodiments described herein relate to a semiconductor device and a method of manufacturing the same.

BACKGROUND

When a protective film is to be formed on a surface of a layer, a phenomenon such as oxidization may occur on the surface of the layer before the protective film is formed, which may make the protection of the surface of the layer be insufficient.

BRIEF DESCRIPTION OF THE DRAWINGS

FIGS. 4A to 9B are cross-sectional views showing a method of manufacturing the semiconductor device of the first embodiment;

FIGS. 11A and 11B are cross-sectional views showing a method of manufacturing the semiconductor device of the comparative example of the first embodiment;

FIGS. 12A to 12C are cross-sectional views showing details of the method of manufacturing the semiconductor device of the first embodiment;

DETAILED DESCRIPTION

Embodiments will now be explained with reference to the accompanying drawings. In FIGS. 1A to 14C, the same configurations are denoted by the same reference symbols and repeated description is omitted.

In one embodiment, a method of manufacturing a semiconductor device includes forming a first layer including a metal element on a substrate, and processing the first layer by dry etching. The method further includes removing a second layer formed on a lateral face of the first layer by wet etching, after processing the first layer, and forming a first film on the lateral face of the first layer by processing the lateral face of the first layer with a liquid, after removing the second layer. Furthermore, the substrate is not exposed to ambient air, after removing the second layer and before forming the first film.

First Embodiment

Figure 1A:
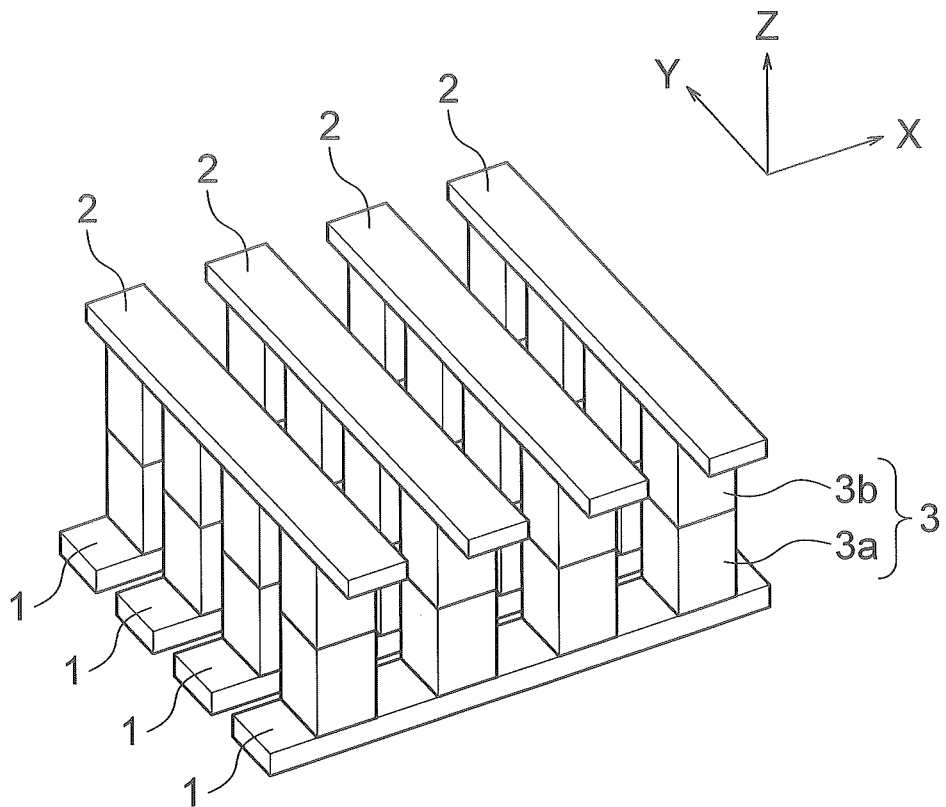
FIGS. 1A and 1B are a perspective view and a cross-sectional view showing a structure of a semiconductor device of a first embodiment.
Figure 1B:
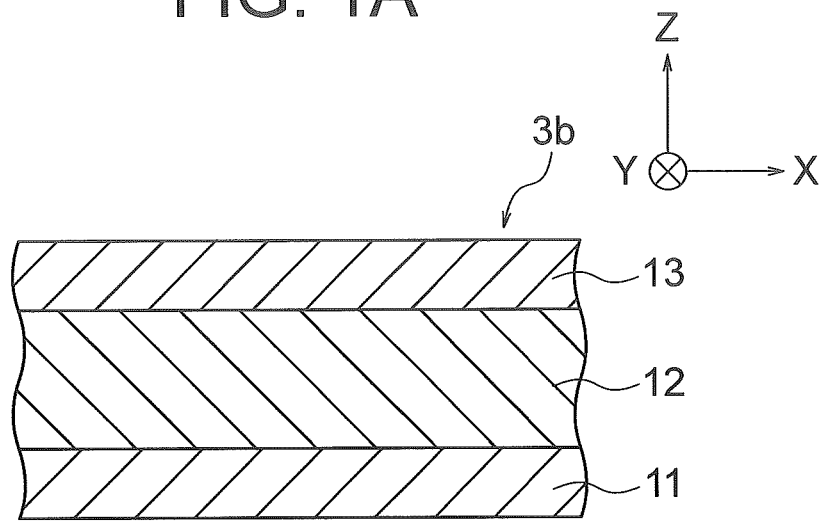

FIGS. 1A and 1B are a perspective view and a cross-sectional view showing a structure of a semiconductor device of a first embodiment.

FIGS. 1A and 1B indicate an X direction, a Y direction, and a Z direction that are perpendicular to one another. In the present specification, a +Z direction is considered to be an upper direction, and a −Z direction is considered to be a lower direction. The −Z direction may and may not correspond to the direction of gravity.

The semiconductor device of the present embodiment includes, as shown in FIG. 1A a plurality of lower interconnects 1 extending in the X direction, a plurality of upper interconnects 2 extending in the Y direction, and a plurality of memory cells 3 provided at intersections of the lower interconnects 1 and the upper interconnects 2. The semiconductor device of the present embodiment is, for example, PCM (Phase Change Memory).

The lower interconnects 1 are provided on an upper side of the substrate which is not illustrated. The lower interconnects 1 are for example metal layers. The upper interconnects 2 are provided on an upper side of the lower interconnects 1. The upper interconnects 2 are for example metal layers. In the present embodiment, one of the lower interconnects 1 and the upper interconnects 2 are word lines, and the other of the lower interconnects 1 and the upper interconnects 2 are bit lines. The lower interconnects 1 and the upper interconnects 2 are examples of the first interconnects and the second interconnects respectively.

Each memory cell 3 is provided between an upper face of the corresponding lower interconnect 1 and a lower face of the corresponding upper interconnect 2. Each memory cell 3 includes, as shown in FIG. 1A, a switching layer 3a provided on a side of the lower interconnect 1 and a resistance change storage element 3b provided on a side of the upper interconnect 2. The switching layer 3a and the resistance change storage element 3b are connected in series between the lower interconnect 1 and the upper interconnect 2. In each memory cell 3, the switching layer 3a may also be provided on the side of the upper interconnect 2, and the resistance change storage element 3b may also be provided on the side of the lower interconnect 1.

The resistance change storage element 3b is capable of being in two states, i.e., a high resistance state and a low resistance state. As a result, the resistance change storage element 3b can function as a non-volatile storage element that stores binary data. A material of the resistance change storage element 3b is described later.

The switching layer 3a includes, for example, B (boron), C (carbon), Al (aluminum), Si (silicon), P (phosphorus), Ga (gallium), Ge (germanium), As (arsenic), Se (selenium), In (indium), Sn (tin) or Sb (antimony). For example, the switching layer 3a has a function of a two-terminal switch including a chalcogen element, and may be formed of a chalcogenide material. The switching layer 3a is an example of the third layer.

The resistance change storage element 3b includes, as shown in FIG. 1B, a lower electrode 11, a resistance change layer 12 provided on the lower electrode 11, and an upper electrode 13 provided on the resistance change layer 12. The lower electrode 11 and the upper electrode 13 are for example metal layers. The lower electrode 11 and the upper electrode 13 are examples of the first electrode and the second electrode respectively.

The resistance change layer 12 includes, for example, Al (aluminum), Co (cobalt), Cu (copper), Ge (germanium), Zr (zirconium), Mo (molybdenum), Ru (ruthenium), Sb (antimony), Te (tellurium), La (lanthanum), Hf (hafnium) or W (tungsten). The resistance change layer 12 of the present embodiment is a layer including a metal element, for example a metal compound layer. The resistance change layer 12 may also be, for example, a metal oxide film, a metal nitride film, or a chalcogenide film. The resistance change layer 12 is an example of the first layer.

The resistance change storage element 3b is in the low resistance state when the resistance change layer 12 is in a crystalline state, and in the high resistance state when the resistance change layer 12 is in an amorphous state.

Figure 2:
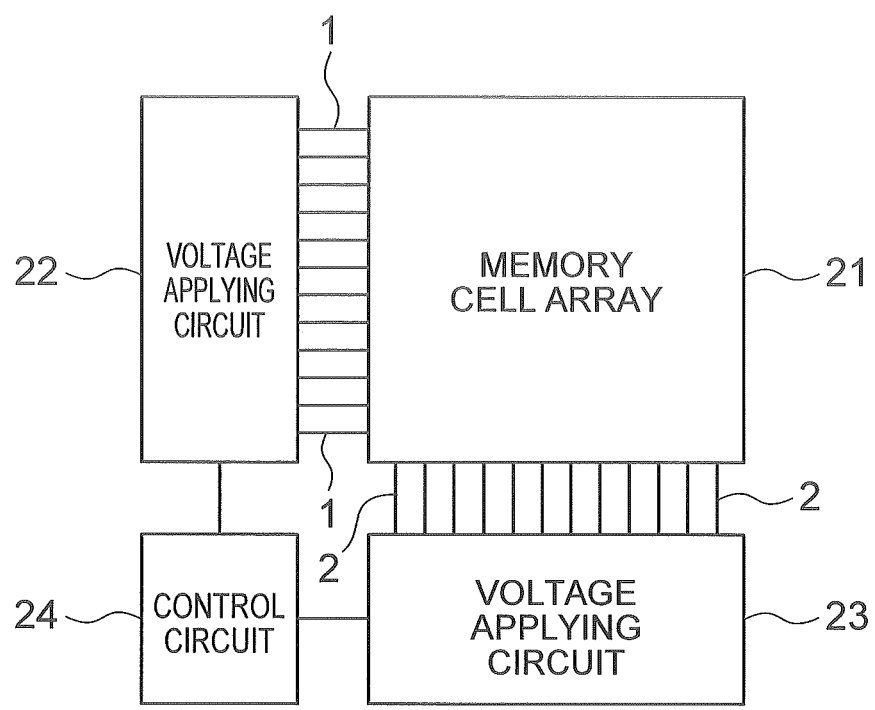
FIG. 2 is a circuit diagram showing a circuit configuration of the semiconductor device of the first embodiment.

FIG. 2 is a circuit diagram showing a circuit configuration of the semiconductor device of the first embodiment.

The semiconductor device of the present embodiment includes a memory cell array 21, a voltage applying circuit 22, a voltage applying circuit 23, and a control circuit 24. The memory cell array 21 includes a plurality of memory cells 3 (see FIG. 1A) arranged in a two-dimensional array patten. The voltage applying circuit 22 applies a voltage to each lower interconnect 1, and the voltage applying circuit 23 applies a voltage to each upper interconnect 2. The control circuit 24 controls operation of these voltage applying circuits 22, 23.

Figure 3:
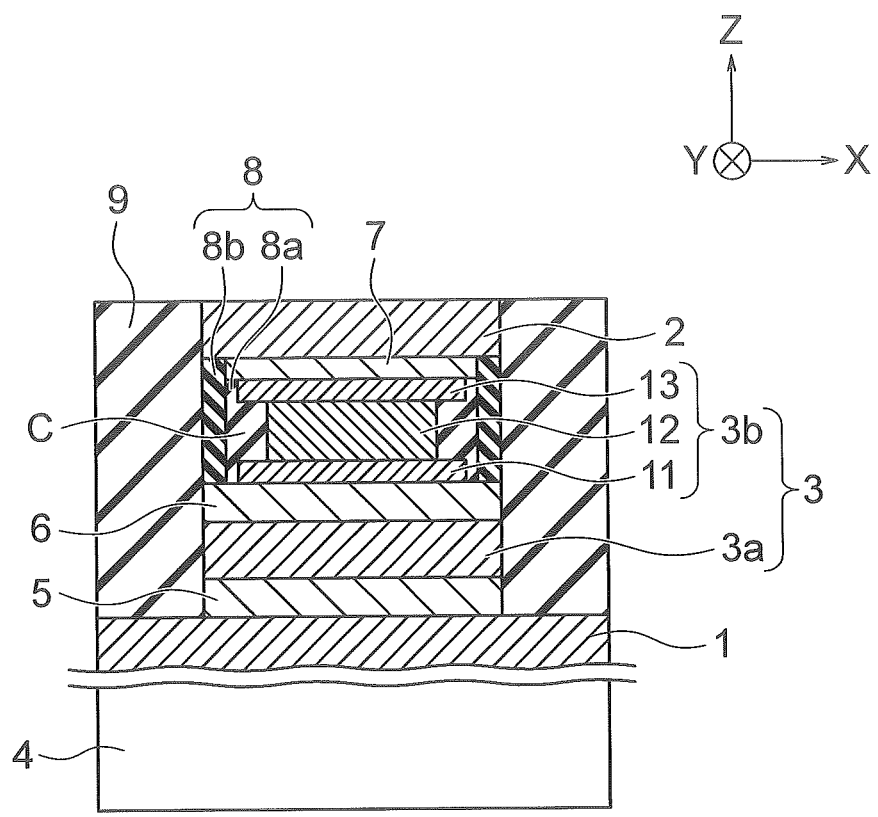
FIG. 3 is a cross-sectional view showing a structure of the semiconductor device of the first embodiment.

FIG. 3 is a cross-sectional view showing a structure of a semiconductor device of a first embodiment. FIG. 3 shows a cross section of one memory cell 3.

The semiconductor device of the present embodiment includes, as shown in FIG. 3, the lower interconnects 1, the upper interconnects 2, and the memory cells 3. FIG. 3 further shows the switching layer 3a and the resistance change storage element 3b in the memory cell 3, and the lower electrode 11, the resistance change layer 12, and the upper electrode 13 in the resistance change storage element 3b.

The semiconductor device of the present embodiment further includes a substrate 4, a carbon containing layer 5, a carbon containing layer 6, a carbon containing layer 7, a protective film 8, and an inter layer dielectric 9. The protective film 8 includes a film 8a and a film 8b.

The substrate 4 is for example a semiconductor substrate such as a Si (silicon) substrate. In FIG. 3, an upper face and a lower face of the substrate 4 are parallel to an XY plane. The semiconductor device of the present embodiment includes, on an upper side of the substrate 4, the lower interconnects 1, the carbon containing layer 5, the switching layer 3a, the carbon containing layer 6, the lower electrode 11, the resistance change layer 12, the upper electrode 13, the carbon containing layer 7, and the upper interconnects 2 in this order. The carbon containing layers 5, 6, 7 are layers including carbon, for example carbon layers.

The protective film 8 is provided for protecting a surface of the resistance change storage element 3b. FIG. 3 shows a concave portion C provided on a lateral face of the resistance change storage element 3b. The concave portion C is formed by an upper face of the lower electrode 11, a lateral face of the resistance change layer 12, and a lower face of the upper electrode 13. A part of the film 8a is embedded in the concave portion C, and interposed between the lower electrode 11 and the upper electrode 13. Therefore, the film 8a is provided on the upper face and the lateral face of the lower electrode 11, the lateral face of the resistance change layer 12, and the lower face and the lateral face of the upper electrode 13. The film 8b is provided on a lateral face of the film 8a and the carbon containing layer 7, and provided between the carbon containing layer 6 and the upper interconnects 2. The film 8a is an example of the first film.

The film 8a is for example an insulator including silicon, oxygen, and carbon, and is provided for protecting the lateral face of the resistance change layer 12. The film 8a of the present embodiment is a $SiO_2$ film (silicon oxide film) including a C (carbon) atom as an impurity atom. The film 8a of the present embodiment may include a further impurity atom.

The film 8a is for example an insulator including silicon and oxygen, and is provided for filling a concave portion between the carbon containing layer 6 and the upper interconnect 2 together with the film 8a. The film 8b of the present embodiment is a $SiO_2$ film. The film 8b of the present embodiment may also include a C atom as an impurity atom. When the film 8a is sufficiently thick, the protective film 8 is not required to include the film 8b.

The inter layer dielectric 9 is formed to cover the lateral face and the upper face of the lower interconnects 1, the carbon containing layer 5, the switching layer 3a, the carbon containing layer 6, the film 8b, and the upper interconnects 2. The inter layer dielectric 9 is embedded between adjacent lower interconnects 1, between adjacent upper interconnects 2, and between adjacent memory cells 3 (see FIG. 1A). The inter layer dielectric 9 is for example a $SiO_2$ film or a laminated film including a $SiO_2$ film.

In FIG. 3, a width of the lower electrode 11 and a width of the upper electrode 13 in the X direction are smaller than a width of the switching layer 3a and a width of the upper interconnect 2 in the X direction. In FIG. 3, furthermore, the width of the lower electrode 11 and the width of the upper electrode 13 in the X direction are greater than a width of the resistance change layer 12 in the X direction. As a result, the concave portion C is formed between the upper face of the lower electrode 11 and the lower face of the upper electrode 13.

FIGS. 4A to 9B are cross-sectional views showing a method of manufacturing the semiconductor device of the first embodiment.

Figure 4B:
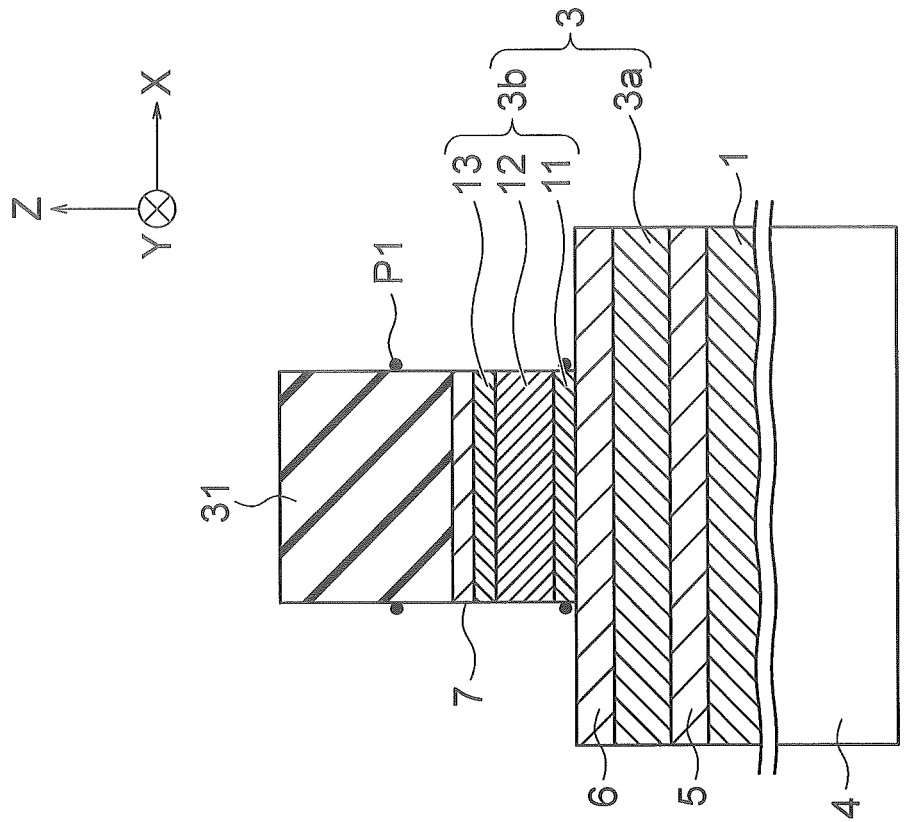
Figure 4A:
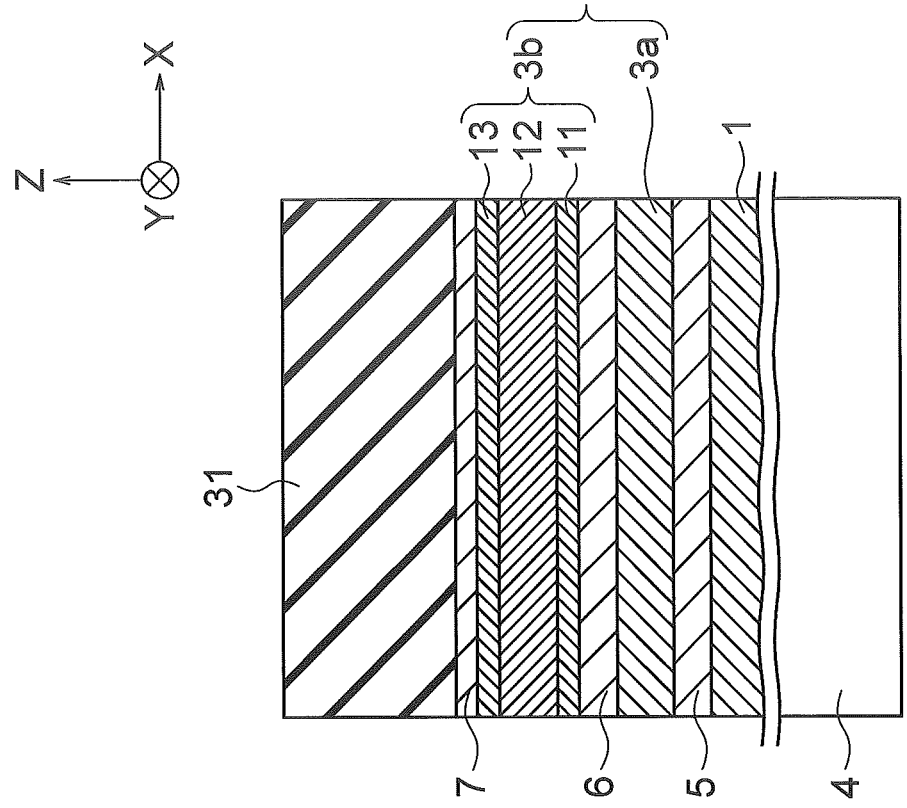

First, on an upper side of the substrate 4, a material of the lower interconnects 1, the carbon containing layer 5, a material of the switching layer 3a, the carbon containing layer 6, a material of the lower electrode 11, the resistance change layer 12, a material of the upper electrode 13, the carbon containing layer 7, and a hard mask layer 31 are formed in this order (FIG. 4A). In FIG. 4A and other drawings described later, for the sake of comprehensibility of the description, the material of the switching layer 3a is denoted by a reference symbol "3a" similarly to the switching layer 3a. The same applies to the material of the lower interconnects 1, the material of the lower electrode 11, and the material of the upper electrode 13.

The material of the switching layer 3a includes, for example, at least any one of B, C, Al, Si, P, Ga, Ge, As, Se, In, Sn, and Sb as described above. The resistance change layer 12 includes, for example, at least any one of Al, Co, Cu, Ge, Zr, Mo, Ru, Sb, Te, La, Hf, and W as described above. The resistance change layer 12 of the present embodiment is a layer including a metal element, for example a metal compound layer. The material of the lower interconnects 1, the material of the lower electrode 11, and the material of the upper electrode 13 are for example metallic materials. The hard mask layer 31 is for example a SiN film (silicon nitride film).

Next, the hard mask layer 31, the carbon containing layer 7, the material of the upper electrode 13, the resistance change layer 12, and the material of the lower electrode 11 are processed into shapes extending in the Y direction by lithography and dry etching (FIG. 4B). FIG. 4B shows a residue P1 remaining on the lateral face of the hard mask layer 31 and the like after the dry etching. The dry etching is for example RIE (Reactive Ion Etching).

After processing the resistance change layer 12 by the step shown in FIG. 4B, a part of the resistance change layer 12 is altered in the vicinity of the lateral face of the resistance change layer 12. As a result, an altered layer 32 is formed on the lateral face of the resistance change layer 12 (FIG. 5A). The altered layer 32 is for example an oxide film formed by oxidization of the resistance change layer 12. The altered layer 32 is an example of the second layer.

Figure 6A:
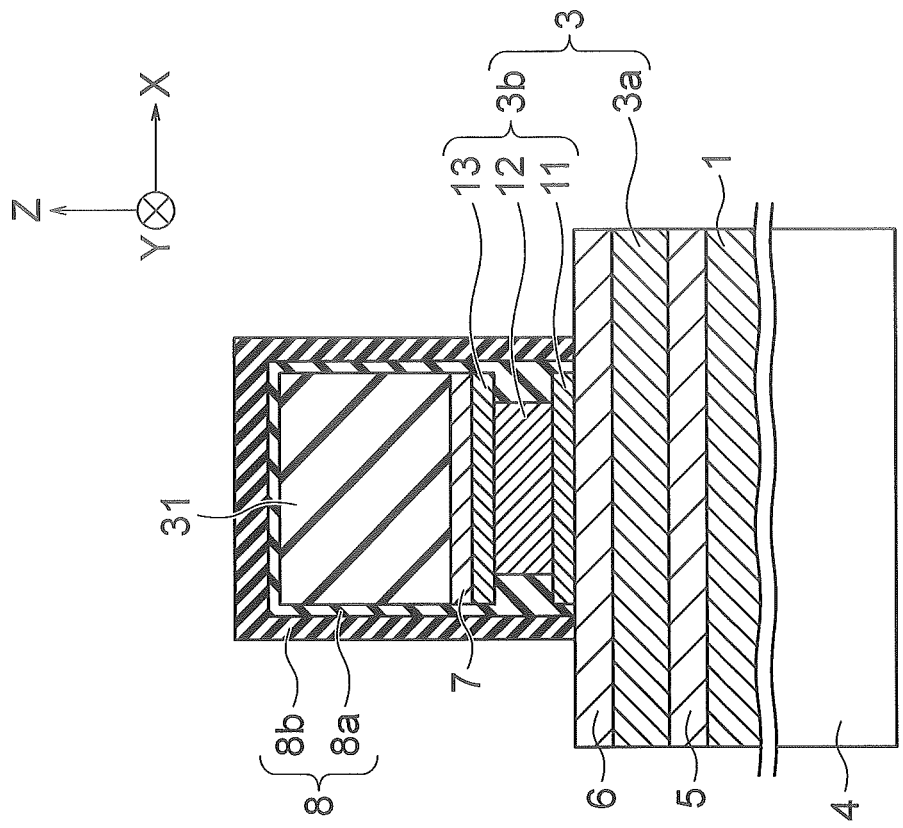

Next, at least one type of liquid L is sequentially supplied to the surface of the substrate 4 (FIGS. 5B and 6A). In the present embodiment, a processing liquid for wet etching, a processing liquid for rinse, a processing liquid for prewetting, and a processing liquid for protective film formation are sequentially supplied to the surface of the substrate 4. The processing liquid for rinse is an example of the first liquid. The processing liquid for prewetting is an example of the second liquid. The processing liquid for protective film formation is an example of the third liquid.

FIG. 5B shows a state in which the processing liquid for wet etching has been supplied to the surface of the substrate 4. In the step shown in FIG. 5B, the altered layer 32 and the residue P1 are removed by wet etching with the processing liquid. The processing liquid is for example a chemical liquid that is capable of removing the altered layer 32 which is an oxide film of the resistance change layer 12. FIG. 5B shows the aforementioned concave portion C formed by removing the altered layer 32.

FIG. 6A shows a state in which the processing liquid for protective film formation has been supplied to the surface of the substrate 4 after the wet etching, the rinse, and the prewetting described above. In the step shown in FIG. 6A, the film 8a is formed from the processing liquid on upper faces and lateral faces of the hard mask layer 31, the carbon containing layer 7, the material of the upper electrode 13, the resistance change layer 12, and the material of the lower electrode 11. This makes it possible to protect the lateral face of the resistance change layer 12 with the film 8a, and to suppress realteration of the resistance change layer 12.

The film 8a is for example an insulator including silicon, oxygen, and carbon as described above. In the present embodiment, in the step shown in FIG. 6A, a $SiO_2$ film is formed as the film 8a. Thereafter, C atoms in the carbon containing layer 5, 6, 7 are diffused in the film 8a, and a $SiO_2$ film including C atoms as impurity atoms is obtained. In the present embodiment, a part of the film 8a is embedded in the concave portion C, and interposed between the lower electrode 11 and the upper electrode 13. The film 8a of the present embodiment is water-repellent.

The processing liquid for protective film formation is for example an organic chemical liquid and, in the present embodiment, includes organic silane. A composition formula of organic silane is $R_1R_2R_3R_4Si$. Si represents silicon, and $R_1$, $R_2$, $R_3$, and $R_4$ each represent hydrogen or an organic group. At least one of $R_1$, $R_2$, $R_3$, and $R_4$ is an organic group. In the present embodiment, the film 8a is formed by a silane coupling reaction of organic silane.

The processing liquid for protective film formation may include toluene or an acetate in addition to organic silane. The processing liquid for protective film formation may also be a chemical liquid in which a silylation reaction is promoted by addition of moisture. The processing liquid for protective film formation may also include an organic silicon compound other than organic silane.

Figure 6B:
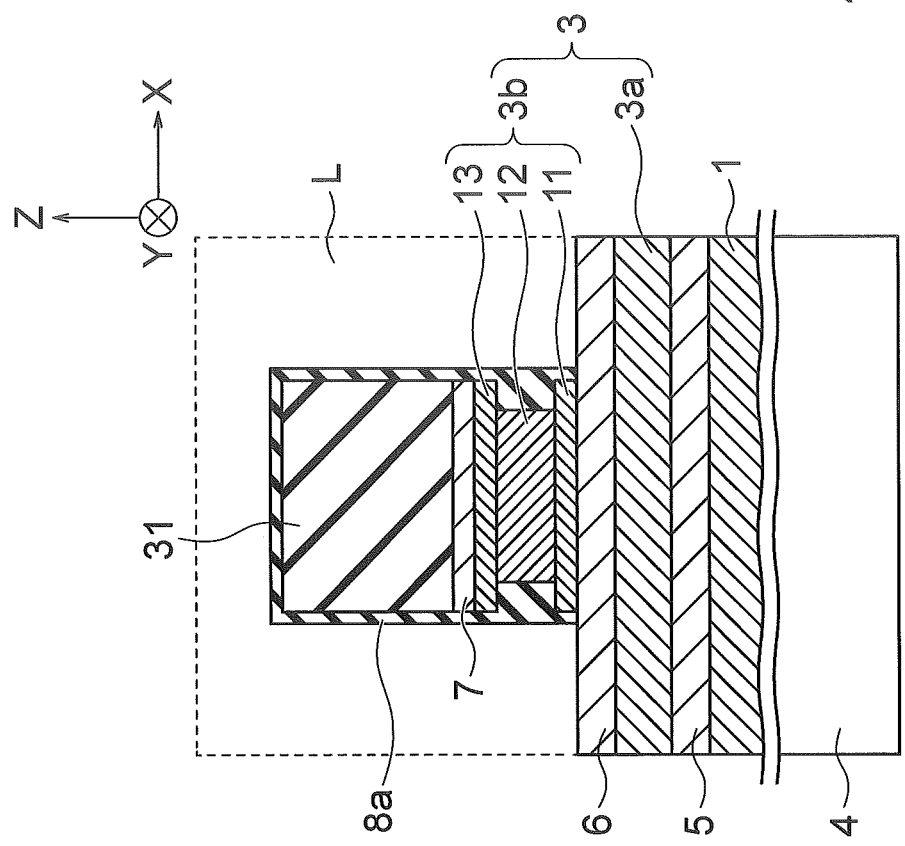

Next, after rinsing and drying the surface of the substrate 4, the film 8b is formed on an upper face, a lateral face, and the like of the film 8a (FIG. 6B). As a result, the protective film 8 is formed on upper faces, lateral faces and the like of the hard mask layer 31, the carbon containing layer 7, the material of the upper electrode 13, the resistance change layer 12, and the material of the lower electrode 11. The film 8b is a $SiO_2$ film formed by, for example, CVD (Chemical Vapor Deposition).

The present embodiment makes it possible to carry out all steps between the state shown in FIG. 5A and the state shown in FIG. 6B, in other words the steps shown in FIG. 5B and FIG. 6A, consistently in the liquid L. Therefore, the present embodiment makes it possible to prevent the lateral face of the resistance change layer 12 from being exposed to ambient air after removal of the altered layer 32 and before formation of the film 8a. This makes it possible to suppress realteration of the resistance change layer 12 after removal of the altered layer 32 and before formation of the film 8a. Furthermore, the present embodiment makes it possible to facilitate management of Q-time. The substrate 4 of the present embodiment is dried out after completion of the step shown in FIG. 6A.

Next, the carbon containing layer 6, the material of the switching layer 3a, and the carbon containing layer 5 are processed into shapes extending in the Y direction by lithography and dry etching (FIG. 7A). FIG. 7A shows a residue P2 remaining on the lateral face of the material of the switching layer 3a and the like after the dry etching. The dry etching is for example RIE.

Next, the residue P2 is removed by wet etching (FIG. 7B). The wet etching is, for example, carried out by using the same processing liquid as the processing liquid for wet etching shown in FIG. 5B.

Next, the insulator 9a for the inter layer dielectric 9 is formed on the entire face of the substrate 4 (FIG. 8A). As a result, the protective film 8 and the like are covered by the insulator 9a. Next, an upper face of the insulator 9a is flattened by CMP (Chemical Mechanical Polishing) (FIG. 8B). As a result, the insulator 9a is thinned, the hard mask layer 31 is removed, and an upper face of the carbon containing layer 7 is exposed from the insulator 9a.

Figure 9A:
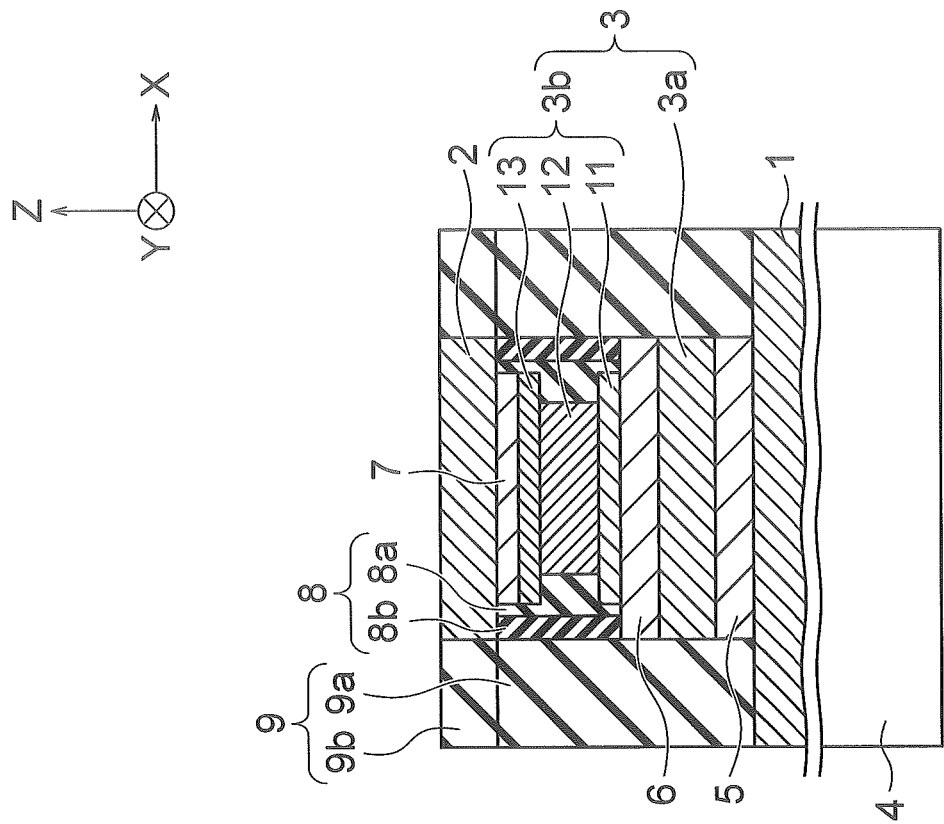

In the present embodiment, between the step shown in FIG. 8B and the step shown in FIG. 9A, the insulator 9a, the film 8b, the film 8a, the carbon containing layer 7, the material of the upper electrode 13, the resistance change layer 12, the material of the lower electrode 11, the carbon containing layer 6, the material of the switching layer 3a, the carbon containing layer 5, and the material of the lower interconnect 1 are processed by lithography and dry etching into a shape extending in the X direction, a cuboid block-like shape, and the like. As a result, the material of the upper electrode 13, the material of the lower electrode 11, the material of the switching layer 3a, and the material of the lower interconnect 1 are respectively processed into the upper electrode 13, the lower electrode 11, the switching layer 3a, and the lower interconnect 1, whereby the resistance change storage element 3b and the memory cell 3 are formed. During this process, a residue similar to the residue P1 remains on a lateral face of the resistance change layer 12 and the like, and an altered layer similar to the altered layer 32 is formed on a lateral face of the resistance change layer 12. Therefore, it is desirable to remove the residue and the altered layer and to form a film similar to the film 8a, by carrying out steps similar to the steps shown in FIG. 5B and FIG. 6A. Furthermore, a film similar to the film 8b may be formed by carrying out a step similar to the step shown in FIG. 6B.

By dry etching in the step shown in FIG. 4B, a plurality of grooves extending in the Y direction are formed on the upper side of the substrate 4. These grooves are filled with the insulator 9a. On the other hand, by dry etching between the step shown in FIG. 8B and the step shown in FIG. 9A, a plurality of grooves extending in the X direction are formed on the upper side of the substrate 4. These grooves are also filled with an insulator, which is not illustrated, for the inter layer dielectric 9.

Figure 9B:
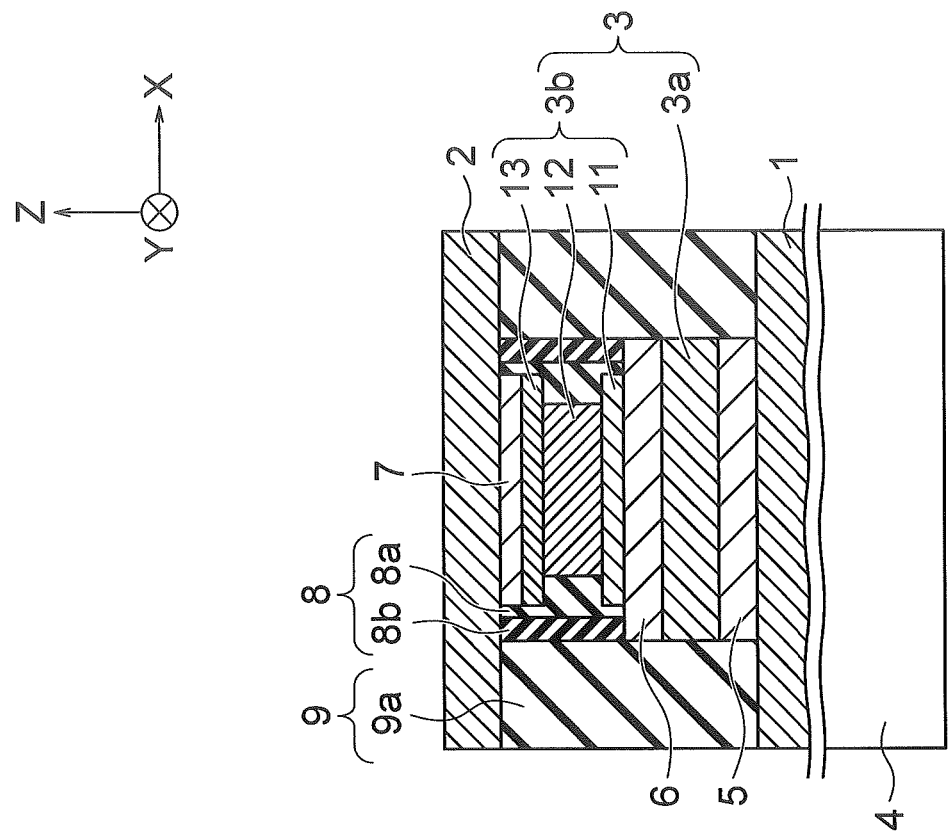

Next, the material of the upper interconnect 2 is formed on the entire face of the substrate 4 (FIG. 9A). As a result, the material of the upper interconnect 2 is formed on an upper face of the carbon containing layer 7 and the like. In FIG. 9A and FIG. 9B described later, for the sake of comprehensibility of the description, the material of the upper interconnect 2 is denoted by a reference symbol "2" similarly to the upper interconnect 2. The material of the upper interconnect 2 is for example a metallic material.

Next, the material of the upper interconnect 2 is processed into a shape extending in the Y direction by lithography and dry etching (FIG. 9A). As a result, the material of the upper interconnect 2 is processed into the upper interconnect 2. Next, the insulator 9b for the inter layer dielectric 9 is embedded between the upper interconnects 2 adjacent to each other in the X direction (FIG. 9B). As described above, the semiconductor device of the present embodiment is manufactured.

Next, the semiconductor device of a comparative example of the first embodiment is described.

Figure 10:
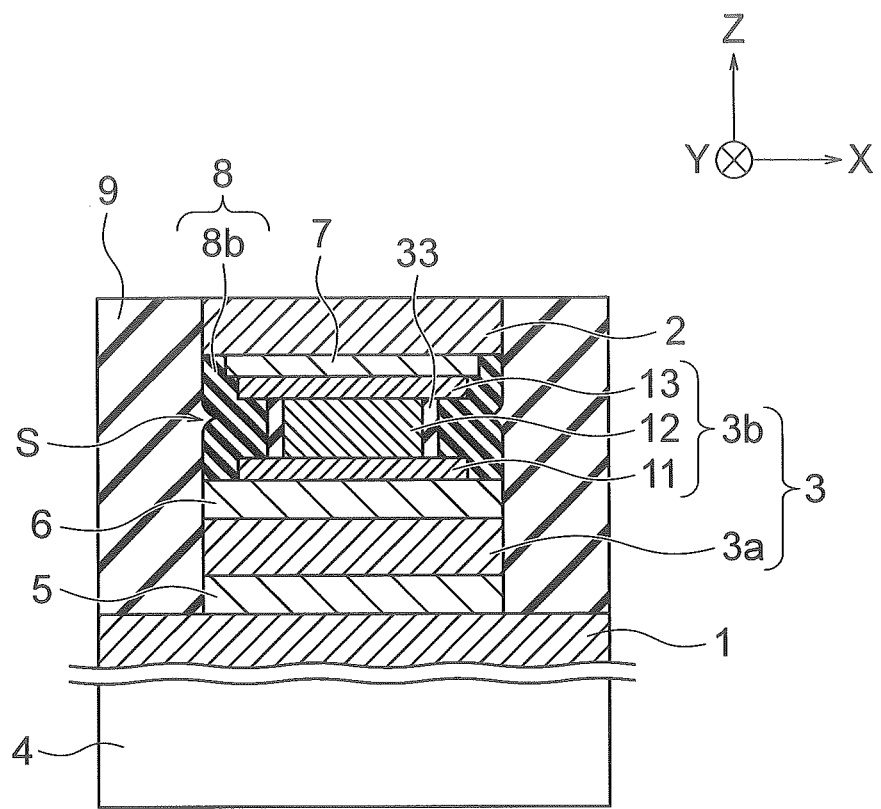
FIG. 10 is a cross-sectional view showing a structure of a semiconductor device of a comparative example of the first embodiment.

FIG. 10 is a cross-sectional view showing a structure of a semiconductor device of a comparative example of the first embodiment.

The semiconductor device of the present comparative example (FIG. 10) includes constitutive elements similar to those of the semiconductor device of the first embodiment (FIG. 3). However, the semiconductor device of the present comparative example does not include the film 8a and includes an altered layer 33 instead. Similarly to the altered layer 32, the altered layer 33 is formed on the lateral face of the resistance change layer 12 by alteration of a part of the resistance change layer 12. The altered layer 33 is for example an oxide film formed by oxidization of the resistance change layer 12. FIG. 10 further indicates a seam S formed on the lateral face of the film 8b.

FIGS. 11A and 11B are cross-sectional views showing a method of manufacturing the semiconductor device of the comparative example of the first embodiment.

First, the steps shown in FIGS. 4A to 5B are carried out. FIG. 11A shows the same state as the state shown in FIG. 5B. In the first embodiment, the altered layer 32 is removed, the film 8a is formed, and then the film 8b is formed by drying out. On the other hand, in the present comparative example, the altered layer 32 is removed, and then the film 8b is formed by drying out. Therefore, the altered layer 33 is formed on the lateral face of the resistance change layer 12, and the film 8b is formed on the lateral face of the altered layer 33 (FIG. 11B). As a result, in the present comparative example, performance of the resistance change layer 12 is reduced. On the other hand, the present embodiment makes it possible to suppress formation of the altered layer 33 by forming the film 8a prior to drying out.

Next, details of the method of manufacturing the semiconductor device of the first embodiment are described.

FIGS. 12A to 12C are cross-sectional views showing details of the method of manufacturing the semiconductor device of the first embodiment.

FIG. 12A shows a processing liquid L1 for rinse. FIG. 12B shows a processing liquid L2 for prewetting. FIG. 12C shows a processing liquid L3 for protective film formation. As described above, in the steps of FIGS. 5B and 6A of the present embodiment, the processing liquid for wet etching, the processing liquid L1 for rinse, the processing liquid L2 for prewetting, and the processing liquid L3 for protective film formation are sequentially supplied to the surface of the substrate 4. FIGS. 12A and 12B show a flow of rinse, prewetting, and formation of the protective film of the present embodiment.

In FIG. 12A, the surface of the substrate 4 such as the lateral face of the resistance change layer 12 is cleansed with the processing liquid L1. The processing liquid L1 is for example a non-organic liquid. The processing liquid L1 of the present embodiment is water, and is desirably pure water such as ultra pure water. FIG. 12A shows a state of washing out the residue P1 with the processing liquid.

In FIG. 12B, the processing liquid L2 is supplied to the surface of the substrate 4 in order to replace the processing liquid L1 with the processing liquid L3. The processing liquid L2 is for example an organic chemical liquid. The processing liquid L2 of the present embodiment includes alcohol, and desirably includes, for example, alcohol compatible with water.

Examples of such alcohol include methanol, ethanol, propanol, butanol, IPA (isopropyl alcohol), and the like. As described later, the processing liquid L2 is desirably supplied to the surface of the substrate 4 along with water.

In FIG. 12C, the film 8a is formed with the processing liquid L3 on the surface of the substrate 4 such as the lateral face of the resistance change layer 12. The processing liquid L3 is for example an organic chemical liquid. The processing liquid L3 of the present embodiment includes organic silane. In the present embodiment, the film 8a is formed by a silane coupling reaction of organic silane.

Figure 13C:
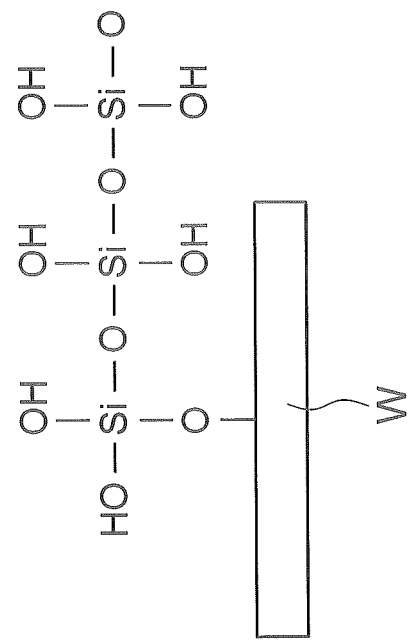
FIGS. 13A to 13C are another set of cross-sectional views showing details of the method of manufacturing the semiconductor device of the first embodiment.
Figure 13B:
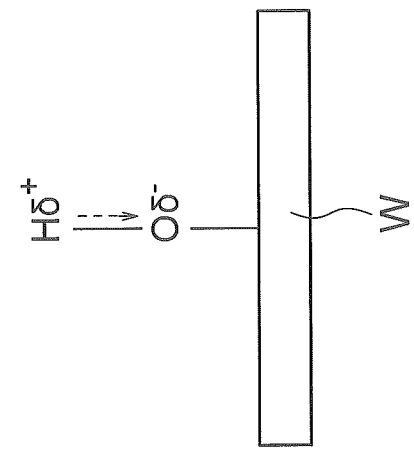
Figure 13A:
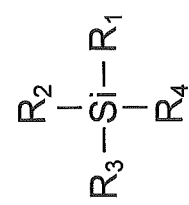

FIGS. 13A to 13C are another set of cross-sectional views showing details of the method of manufacturing the semiconductor device of the first embodiment.

FIG. 13A shows a structural formula of organic silane ($R_1R_2R_3R_4Si$) in the processing liquid L3 of the present embodiment. FIG. 13B schematically shows the substrate 4 and other constitutive elements shown in FIG. 12C as a wafer W. FIGS. 13B and 13C schematically show a state in which a silane coupling reaction of organic silane occurs. The present embodiment makes it possible to suitably form the film 8a even on a surface of a layer (for example, the resistance change layer 12) in which a density of OH group (hydroxyl group) is low.

Figure 14C:
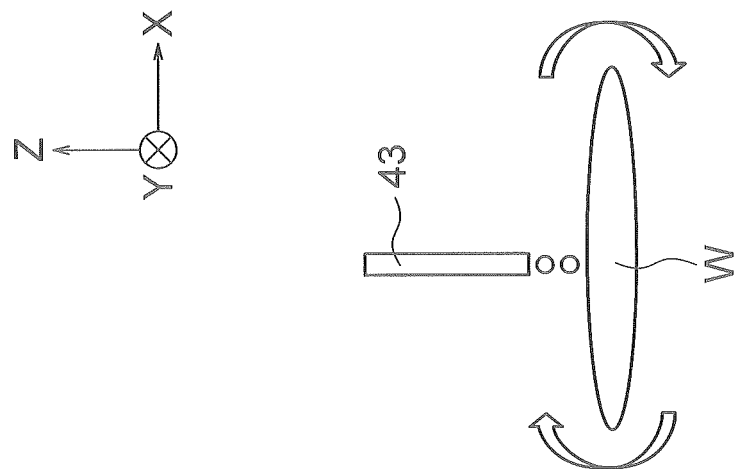
FIGS. 14A to 14C are another set of cross-sectional views showing details of the method of manufacturing the semiconductor device of the first embodiment.
Figure 14B:
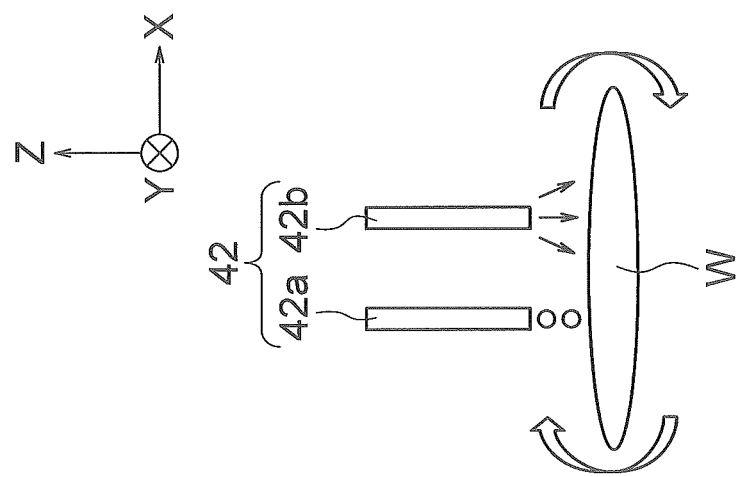
Figure 14A:
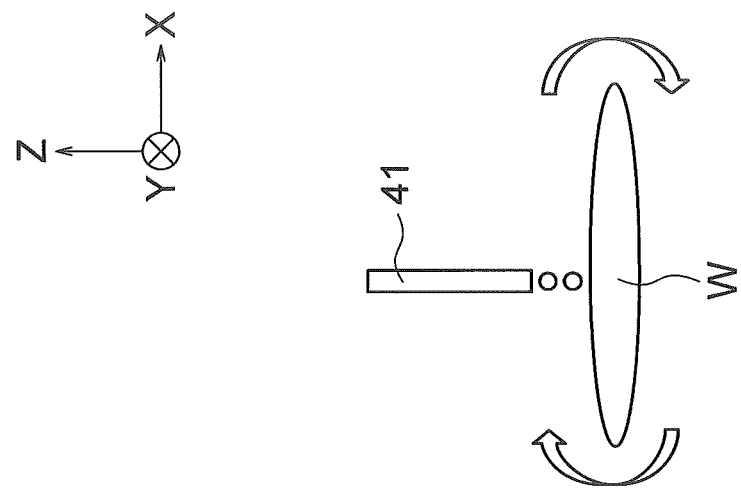

FIGS. 14A to 14C are another set of cross-sectional views showing details of the method of manufacturing the semiconductor device of the first embodiment.

FIG. 14A shows a state in which the processing liquid L1 is supplied to a surface of the wafer W. The processing liquid L1 of the present embodiment is supplied from, for example, a processing liquid supplying portion 41 to the wafer W. The processing liquid supplying portion 41 includes a nozzle that discharges or drips the processing liquid L1 onto the wafer W. FIG. 14A shows a state in which the processing liquid L1 is supplied to the wafer W while the wafer W is rotated.

FIG. 14B shows a state in which the processing liquid L2 and water are supplied to the surface of the wafer W. The processing liquid L2 of the present embodiment and water are supplied from, for example, a processing liquid supplying portion 42 to the wafer W. The processing liquid supplying portion 42 includes a nozzle 42a that discharges or drips the processing liquid L2 onto the water W and a spray 42a that sprays water onto the wafer W. The water is supplied for, for example, facilitating replacement of the processing liquid L1 with the processing liquid L3. The water is for example pure water such as ultra pure water. FIG. 14B shows a state in which the processing liquid L2 and water are supplied to the wafer W while the wafer W is rotated.

During this process, a flow rate of water supplied to the wafer W is desirably set to be 100 ppm % to 1% of a total flow rate of the processing liquid L2 and water supplied to the wafer W. This makes it possible to further facilitate replacement of the processing liquid L1 with the processing liquid L3. In this case, since the flow rate of water is low, water is desirably supplied by spraying. This makes it possible to suitably supply water to the entire surface of the wafer W.

FIG. 14C shows a state in which the processing liquid L3 is supplied to the surface of the wafer W. The processing liquid L3 of the present embodiment is supplied from, for example, a processing liquid supplying portion 43 to the wafer W. The processing liquid supplying portion 43 includes a nozzle that discharges or drips the processing liquid L3 onto the wafer W. FIG. 14C shows a state in which the processing liquid L3 is supplied to the wafer W while the wafer W is rotated.

As described in the foregoing, when the semiconductor device of the present embodiment is manufactured, the film 8a is formed on the surface of the resistance change layer 12 in a state in which the resistance change layer 12 is present in the liquid L. Therefore, the present embodiment makes it possible to suitably protect the surface of the resistance change layer 12.

The semiconductor device of the present embodiment may also be a device other than PCM. In addition, the film 8a of the present embodiment may also be formed on a surface of a layer other than the resistance change layer 12. For example, the film 8a may also be formed on a lateral face and an upper face of any metal layer (for example an electrode layer and an interconnect layer). This makes it possible to protect the lateral face and the upper face of the metal layer with the film 8a. The metal layer may be either a metal simple substance layer or a metal compound layer.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A method of manufacturing a semiconductor device, comprising:
    forming a first layer including a metal element on a substrate;
    processing the first layer by dry etching;
    removing a second layer formed on a lateral face of the first layer by wet etching, after processing the first layer; and
    forming a first film on the lateral face of the first layer by processing the lateral face of the first layer with a liquid, after removing the second layer,
    wherein the substrate is not exposed to ambient air, after removing the second layer and before forming the first film.

2. The method of claim 1, wherein the liquid includes organic silane.

3. The method of claim 1, wherein the first film is formed by a silane coupling reaction.

4. The method of claim 1, wherein the first film includes silicon, oxygen and carbon.

5. The method of claim 1, wherein the first layer includes Al (aluminum), Co (cobalt), Cu (copper), Ge (germanium), Zr (zirconium), Mo (molybdenum), Ru (ruthenium), Sb (antimony), Te (tellurium), La (lanthanum), Hf (hafnium) or W (tungsten).

6. The method of claim 1, further comprising:
    forming a first interconnect on the substrate;
    forming a third layer on the first interconnect; and
    forming a second interconnect on the third layer via the first layer.

7. The method of claim 6, wherein the third layer has a function of a switch, and the first layer is included in a resistance change storage element of a memory cell.

8. The method of claim 6, wherein the third layer includes B (boron), C (carbon), Al (aluminum), Si (silicon), P (phosphorus), Ga (gallium), Ge (germanium), As (arsenic), Se (selenium), In (indium), Sn (tin) or Sb (antimony).

9. A method of manufacturing a semiconductor device, comprising:
    forming a first layer including a metal element on a substrate;
    processing the first layer with a first liquid that is a non-organic liquid;
    processing the first layer having been processed with the first liquid with a second liquid that is an organic liquid; and
    processing the first layer having been processed with the second liquid with a third liquid that is an organic liquid and includes organic silane.

10. The method of claim 9, wherein the first liquid is water.

11. The method of claim 9, wherein a surface of the first layer is cleaned by processing the first layer with the first liquid.

12. The method of claim 9, wherein the second liquid includes alcohol.

13. The method of claim 12, wherein the alcohol includes methanol, ethanol, propanol, butanol or IPA (isopropyl alcohol).

14. The method of claim 9, wherein a process using the second liquid facilitates replacement of the first liquid with the third liquid.

15. The method of claim 9, wherein the second liquid and water are supplied to the first layer, when the first layer is processed with the second liquid.

16. The method of claim 15, wherein a flow rate of the water supplied to the first layer is 100 ppm % to 1% of a total flow rate of the second liquid and the water.

17. The method of claim 15, wherein the water is supplied to the first layer by spraying.

18. The method of claim 9, wherein a first film is formed on a surface of the first layer by processing the first layer with the third liquid.

19. A semiconductor device comprising:
    a substrate;

a first interconnect provided on the substrate;
a first electrode provided on the first interconnect;
a first layer provided on the first electrode;
a second electrode provided on the first layer; and
a second interconnect provided on the second electrode,
wherein a width of the first electrode or the second electrode is greater than a width of the first layer.

20. The device of claim 19, further comprising a first film that is provided on a lateral face of the first layer including a metal element, and includes silicon, oxygen and carbon.

* * * * *